United States Patent
Wu et al.

(10) Patent No.: US 6,972,489 B2
(45) Date of Patent: Dec. 6, 2005

(54) FLIP CHIP PACKAGE WITH THERMOMETER

(75) Inventors: Jeng Da Wu, Kaohsiung (TW); Ching Hsu Yang, Taichung (TW)

(73) Assignee: Advanced Semiconductor Engineering, Inc. (TW)

( * ) Notice: Subject to any disclaimer, the term of this patent is extended or adjusted under 35 U.S.C. 154(b) by 62 days.

(21) Appl. No.: 10/639,579

(22) Filed: Aug. 13, 2003

(65) Prior Publication Data

US 2004/0032025 A1 Feb. 19, 2004

(30) Foreign Application Priority Data

Aug. 16, 2002 (TW) ..................... 91118865 A

(51) Int. Cl.⁷ ............................... H01L 29/40
(52) U.S. Cl. ................ 257/734; 257/778; 257/779; 257/780
(58) Field of Search ............... 257/734–739, 257/778

(56) References Cited

U.S. PATENT DOCUMENTS

| | | | | |
|---|---|---|---|---|
| 6,126,059 A | * | 10/2000 | MacKay et al. | 228/9 |
| 6,188,044 B1 | * | 2/2001 | Lee et al. | 219/390 |
| 6,196,002 B1 | * | 3/2001 | Newman et al. | 62/3.7 |
| 6,570,250 B1 | * | 5/2003 | Pommer | 257/731 |
| 2003/0047807 A1 | * | 3/2003 | Alcoe et al. | 257/734 |
| 2004/0065880 A1 | * | 4/2004 | Hunt et al. | 257/48 |

* cited by examiner

*Primary Examiner*—Long Pham
*Assistant Examiner*—Nathan W. Ha

(57) ABSTRACT

A flip chip package with a thermometer comprises a chip, a substrate, and a thermocouple. The chip has an active surface and a plurality of bumps disposed on the active surface. The substrate defines a region for disposing the chip, and comprises a plurality of bump pads disposed on the region, corresponding to the bumps, and electrically connected to the bumps. Each of the thermocouples comprises a thermal contact which is disposed between the substrate and one of the bumps of the chip.

22 Claims, 3 Drawing Sheets

FLIP CHIP PACKAGE WITH THERMOMETER

CROSS REFERENCE TO RELATED APPLICATION

This application claims the priority benefit of Taiwan patent application serial No. 091118865, filed on Aug. 16, 2002, and the full disclosure thereof is incorporated herein by reference.

BACKGROUND OF THE INVENTION

1. Field of the Invention

The present invention relates to a semiconductor package, and more particularly, to a flip chip semiconductor package with a thermocouple for measuring the temperature of the chip.

2. Description of the Related Art

As the need has arisen for higher performance of computers and other electrical devices, the semiconductor device has to operate with higher power and be manufactured with higher density. Therefore, the heat generated by the semiconductor device is comparatively increased, and the thermal performance of the semiconductor device is emphasized increasingly.

FIG. 1 depicts a flip chip package 10 according to the prior art which comprises a chip 20 disposed on a substrate 30 by the flip chip technique. The chip 20 is electrically connected to the substrate 30 by a plurality of bumps 22, such as solder bumps. The bumps 22 can be made by the well-known C4 (Controlled Collapse Chip Connection) processes. An underfill encapsulant 25 is disposed between the chip 20 and the substrate 30 for encapsulating the chip 20.

In general, the package 10 further comprises a heat sink (not shown) covering the chip 20 and the substrate 30, and a thermal paste (not shown) disposed between the back surface of the chip 20 and the heat sink for conducting the heat generated by the chip 20 to the heat sink and increasing the performance of the heat dissipation so as to keep the temperature of the chip 20 within a suitable range.

In operation, the temperature distribution of the chip 20 is uneven. Because of the unevenness of the heat transfer and the heat generated by the chip 20, some places or portions of the chip 20 could exceed the critical temperature. More specifically, the heat sink only contacts the back surface of the chip 20, but the active surface of the chip 20 which generates the heat, i.e. where has the highest temperature, faces to the substrate 30. However, there is not any suitable device provided in the prior art for measuring the temperature of the active surface or the bump 22 on the active surface.

Accordingly, there exists a need for a device which is able to measure the temperature of the active surface or the bump of the chip in the flip chip package.

SUMMARY OF THE INVENTION

It is an object of the present invention to provide a flip chip package with a thermometer device for measuring the temperature of the active surface or the bump of the chip in the package.

In order to achieve the above object, the present invention provides a flip chip package with a thermometer which comprises a chip, a substrate, and a thermocouple. The chip has an active surface and a plurality of bumps disposed on the active surface. The substrate defines a region for disposing the chip, and comprises a plurality of bump pads disposed on the region, corresponding to the bumps, and electrically connected to the bumps. Each of the thermocouples comprises a thermal contact which is disposed between the substrate and one of the bumps of the chip.

The present invention further provides a method for measuring the temperature of bumps or an active surface of a chip in a flip chip package. According to the steps of the method, a chip which has an active surface and a plurality of bumps disposed on the active surface is provided. A substrate which has a region on which the chip is disposed and comprising a plurality of bump pads disposed on the region and corresponding to the bumps is provided. A through hole is formed on one of the bump pads of the substrate. A thermocouple which has a thermal contact and two wires is provided. The two wires are passed through the through hole, and the thermal contact is positioned on the said bump pad. The bumps of the chip are connected to the bump pads of the substrate, and the thermal contact is connected to one of the bumps.

Accordingly, the package according to the present invention is provided with a thermocouple which is disposed between the chip and substrate and is in contact with one of the bumps so as to measure the temperature of the bumps and the chip in the package.

BRIEF DESCRIPTION OF THE DRAWINGS

Other objects, advantages, and novel features of the invention will become more apparent from the following detailed description when taken in conjunction with the accompanying drawing.

DESCRIPTION OF THE PREFERRED EMBODIMENT

Figure 1:
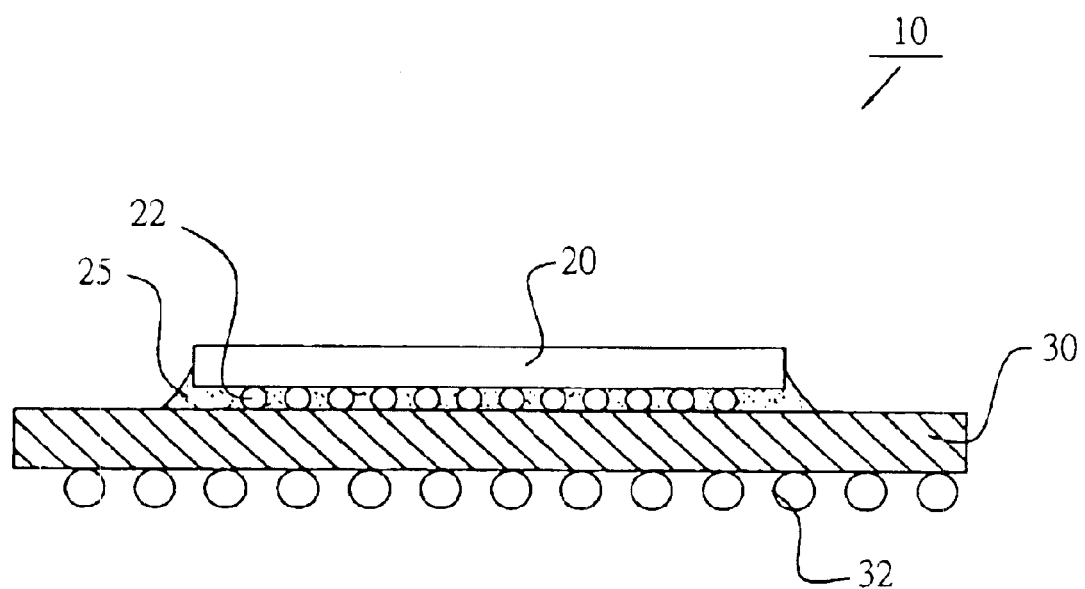
FIG. 1 is a schematic cross-sectional view of a flip chip package in the prior art.
Figure 2:
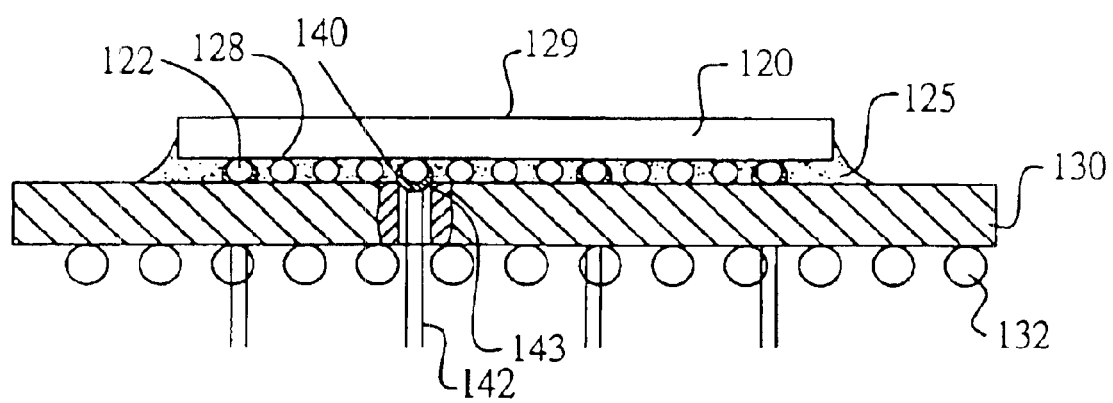
FIG. 2 is a schematic cross-sectional view of a flip chip package according to an embodiment of the present invention.
Figure 3:
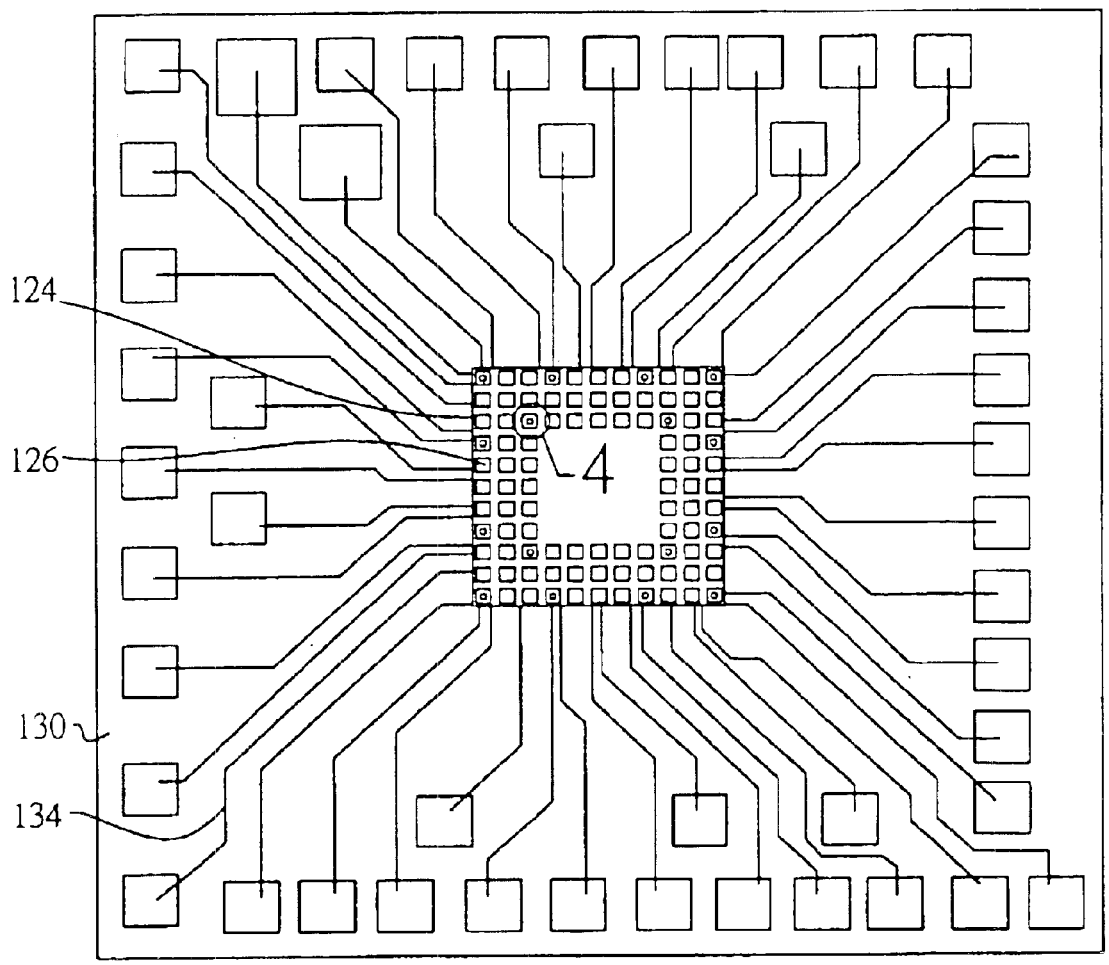
FIG. 3 is a schematic top plan view of the substrate shown in FIG. 2.
Figure 4:
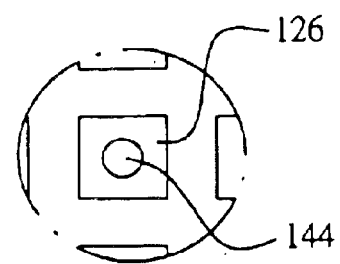
FIG. 4 is a partial enlarged view of area 4 shown in FIG. 3.

Referring to FIG. 2, it depicts a flip chip package 100 according to an embodiment of the present invention. The package 100 comprises a chip 120 mounted on a substrate 130 by the flip chip technique. The chip 120 has an active surface 128 which comprises electrical elements and faces the substrate 130. A plurality of bumps 122, such as solder or gold bumps, are disposed on the active surface 128 of the chip 120 for electrically connecting the electrical elements of the chip 120 to a plurality of traces 134 (shown in FIG. 3) of the substrate 130. As shown in FIG. 3, the substrate 130 defines a region 124 and the chip 120 is disposed on the region 124. In the region 124, the substrate 130 is provided with a plurality of bump pads 126 corresponding to and electrically connected to the bumps 122 of the chip 120. The bump pads 126 are electrically connected to the traces 134 and further electrically connected to the solder balls 132 of the substrate 130.

A through hole 144 which is about 100 um in diameter is formed, such as by drilling or etching, on the bump pad 126 for receiving a micro thermocouple 140. The micro thermocouple 140 comprises a thermal contact 143 which is about 1 mil in dimensions and two wires 142. While the temperature of the thermal contact 143 varies, voltage is generated between the two wires 142 so as to measure the temperature at the thermal contact 143.

After the wires 142 of the micro thermocouple 140 pass through the through hole 144 and the thermal contact 143 is mounted on the through hole 144, the chip 120 is disposed on the substrate 130 by the flip chip technique. Since the thermal contact 143 is positioned on the bump pad 126, the thermal contact 143 is in contact with one of the bumps 122 and is further connected to or associated with the said bump 122 by the reflow process of the flip chip technique. In this arrangement, the temperature of the thermal contact 143 is precisely corresponding to the temperature of the bump 122 or the chip 120, and induces the voltage between the two wires 142 such that the temperature of the bump 122 or the chip 120 is precisely measured.

It will be apparent to those skilled in the art that an underfill encapsulant 125 is provided between the chip 120 and the substrate 130 for encapsulating the chip 120. The underfill encapsulant 125 is filled between the chip 120 and the substrate 130 by the underfill encapsulation process of the flip chip technique.

Furthermore, it will be apparent to those skilled in the art that the solder ball 132 of the substrate 130 is connected to an external printed circuit board (not shown). The printed circuit board can be also provided with a through holes for receiving a thermocouple so as to measure the temperature of the solder ball 132 on the substrate 130.

As indicated in the above description, the package according to the present invention is provided with a thermocouple which is disposed between the chip and substrate and is in contact with one of the bumps so as to measure the temperature of the bumps and the chip in the package.

While the foregoing description and drawings represent the preferred embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A flip chip package with a thermometer comprising:
   a chip defining an active surface and having a plurality of bumps disposed on the active surface;
   a substrate defining a region on which the chip is disposed, and having a plurality of bump pads disposed on the region, corresponding to the bumps, and electrically connected to the bumps; and
   at least one thermocouple having a thermal contact which is disposed between the substrate and one of the bumps of the chip.

2. The flip chip package as claimed in claim 1, wherein the thermal contact of the thermocouple is about 1 mil in diameter.

3. The flip chip package as claimed in claim 1, wherein one of the bump pads of the substrate further comprises a through hole and the thermocouple further comprises two wires passed through the through hole.

4. The flip chip package as claimed in claim 3, wherein the through hole is about 100 $\mu$m in diameter.

5. The flip chip package as claimed in claim 1, further comprising an underfill encapsulant filled between the chip and the substrate.

6. The flip chip package as claimed in claim 1, wherein said thermocouple is said thermometer.

7. The flip chip package as claimed in claim 1, wherein said thermocouple is configured to induce a measurable voltage that changes depending on a temperature of said thermal contact.

8. The flip chip package as claimed in claim 3, wherein said thermocouple is configured to induce a voltage between said two wires, said voltage changing depending on a temperature of said thermal contact.

9. The flip chip package as claimed in claim 3, wherein said wires are physically spaced from an inner wall of said through hole.

10. The flip chip package of claim 1, wherein
    said thermocouple comprises said thermal contact and two wires; and
    when the temperature of the thermal contact varies, a voltage is generated between the two wires so as to allow measurement of the temperature of the thermal contact.

11. The flip chip package of claim 10, wherein
    said thermal contact of said thermocouple is in contact with and connected to said one of the bumps of the chip; and
    the temperature of the thermal contact precisely corresponds to the temperature of said one of the bumps or the chip, and induces said voltage between said two wires so that the temperature of said one of the bumps or the chip is precisely measured.

12. A method for measuring the temperature of a flip chip package comprising the steps of:
    providing a chip defining an active surface and comprising a plurality of bumps disposed on the active surface;
    providing a substrate defining a region on which the chip is disposed, and having a plurality of bump pads disposed on the region and corresponding to the bumps;
    forming a through hole on one of the bump pads of the substrate;
    providing a thermocouple which is a thermometer having a thermal contact and two wires;
    passing the two wires through the through hole, and positioning the thermal contact on the one of the bump pads of the substrate; and
    electrically connecting the bumps of the chip to the bump pads of the substrate, and connecting one of the bumps to the thermal contact.

13. The method as claimed in claim 12, wherein the thermal contact of the thermocouple is about 1 mil in diameter.

14. The method as claimed in claim 12, wherein the through hole is about 100 $\mu$m in diameter.

15. The method as claimed in claim 12, further comprising the step of:
    filling an underfill encapsulant between the chip and the substrate.

16. The method as claimed in claim 12, further comprising the steps of
    measuring a voltage between said two wires; and based on the measured voltage, determining a temperature of said thermal contact, and hence, of the bump on which the thermal contact is positioned.

17. The method as claimed in claim 12, further comprising the steps of providing a printed circuit board forming a through hole through the printed circuit board;

providing a second thermocouple having a second thermal contact and two wires;

passing the two wires of the second thermocouple through the through hole of the printed circuit board, and positioning the second thermal contact to correspond to one of solder balls of the substrate;

electrically connecting the solder balls of the substrate to the printed circuit board, thereby connecting said solder ball to the second thermal contact;

measuring a voltage between said two wires of the second thermocouple; and based on the measured voltage between said two wires of the second thermocouple, determining a temperature of said second thermal contact, and hence, of the solder bump on which the second thermal contact is positioned.

18. The method as claimed in claim 12, further comprising the steps of generating a voltage between said two wires as the temperature of the thermal contact varies; and measuring the temperature of said thermal contact based on said voltage.

19. A method of measuring a temperature of a bump or an active surface or a chip package, said method comprising the steps of:

positioning a temperature measuring element on one of a plurality of bumps located on the active surface of said chip of said chip package;

inducing a voltage, by said temperature measuring element, depending on a temperature of said chip at said one bump;

measuring the induced voltage; and determining the temperature of said chip at said one bump based on the measured temperature.

20. The method of claim 19, wherein said temperature measuring element is a thermocouple.

21. The method of claim 19, further comprising connecting two wires to different portions of said temperature measuring element; and measuring the induced voltage across said two wires.

22. The method of claim 21, further comprising physically attaching and electrically connecting the bumps of said chip to corresponding bump pads of a substrate which has a through hole at a location corresponding to said one bump on which the temperature measuring element is positioned; and passing the wires through said through hole.

\* \* \* \* \*